(12) United States Patent
Shao

(10) Patent No.: US 12,262,531 B2
(45) Date of Patent: Mar. 25, 2025

(54) MEMORY CELL STRUCTURE, MEMORY ARRAY STRUCTURE, SEMICONDUCTOR STRUCTURE HAVING A CAPACITOR STRUCTURE SURROUNDED ON THE OUTER SIDE OF THE WORD LINE

(71) Applicant: CHANGXIN MEMORY TECHNOLOGIES, INC., Hefei (CN)

(72) Inventor: Guangsu Shao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 419 days.

(21) Appl. No.: 17/824,905

(22) Filed: May 26, 2022

(65) Prior Publication Data
US 2023/0262964 A1 Aug. 17, 2023

Related U.S. Application Data

(63) Continuation of application No. PCT/CN2022/077731, filed on Feb. 24, 2022.

(30) Foreign Application Priority Data

Feb. 14, 2022 (CN) .......................... 202210133620.7

(51) Int. Cl.
*H10B 12/00* (2023.01)
(52) U.S. Cl.
CPC ....... *H10B 12/485* (2023.02); *H10B 12/0387* (2023.02); *H10B 12/37* (2023.02); *H10B 12/482* (2023.02)

(58) Field of Classification Search
CPC .. H10B 12/0387; H10B 12/37; H10B 12/482; H10B 12/485
USPC .................................................. 257/296, 300
See application file for complete search history.

(56) References Cited

U.S. PATENT DOCUMENTS

| 5,396,093 A | 3/1995 | Lu |
| 2023/0269931 A1* | 8/2023 | Lee ................... H01L 29/42392 257/296 |

* cited by examiner

*Primary Examiner* — Hoai V Pham
(74) *Attorney, Agent, or Firm* — Kilpatrick Townsend & Stockton LLP

(57) ABSTRACT

Provided are a memory cell structure, a memory array structure, a semiconductor structure and a manufacturing method thereof. The memory cell structure includes: a substrate, an active region, a word line structure, an insulating dielectric layer, and a capacitor structure. The substrate has a bit line structure therein, and the active region is positioned on the bit line structure. In a direction perpendicular to the substrate, the active region includes a first connection terminal, a second connection terminal away from the first connection terminal, and a channel region positioned between the first connection terminal and the second connection terminal. In the direction perpendicular to the substrate, the word line structure covers a sidewall of the channel region. The insulating dielectric layer covers an outer side of the word line structure, an outer side of the first connection terminal, and an outer side of the second connection terminal.

13 Claims, 10 Drawing Sheets

MEMORY CELL STRUCTURE, MEMORY ARRAY STRUCTURE, SEMICONDUCTOR STRUCTURE HAVING A CAPACITOR STRUCTURE SURROUNDED ON THE OUTER SIDE OF THE WORD LINE

CROSS-REFERENCE TO RELATED APPLICATION

This application is a continuation of PCT/CN2022/077731, filed on Feb. 24, 2022, which claims priority to Chinese Patent Application No. 2022101336207 titled "MEMORY CELL STRUCTURE, MEMORY ARRAY STRUCTURE, SEMICONDUCTOR STRUCTURE AND MANUFACTURING METHOD THEREOF" and filed to the State Patent Intellectual Property Office on Feb. 14, 2022, the entire contents of which are incorporated herein by reference.

TECHNICAL FIELD

The present disclosure relates to the field of semiconductor fabrication, and more particularly, to a memory cell structure, a memory array structure, a semiconductor structure and a manufacturing method thereof.

BACKGROUND

With the continuous development of the integrated circuit industry, traditional devices with planar structure are difficult to meet requirements of circuit design, so devices with non-planar structure emerge as the times require. The devices with non-planar structures include silicon on insulator (SOI), dual-gate, multi-gate, nanowire field effect transistors, and three-dimensional DRAM structures.

However, although traditional three-dimensional DRAM manufacturing processes can stack multiple layers of DRAM, a single layer has a larger layer height, resulting in a lower DRAM density.

SUMMARY

According to some embodiments of the present disclosure, there are provided a memory cell structure, a memory array structure, a semiconductor structure and a manufacturing method thereof.

According to some embodiments, a first aspect of the present disclosure provides a memory cell structure, including: a substrate, an active region, a word line structure, an insulating dielectric layer, and a capacitor structure. The substrate has a bit line structure therein, and the active region is positioned on the bit line structure. In a direction perpendicular to the substrate, the active region includes a first connection terminal, a second connection terminal away from the first connection terminal, and a channel region positioned between the first connection terminal and the second connection terminal, wherein the first connection terminal is electrically connected to the bit line structure. In the direction perpendicular to the substrate, the word line structure covers a sidewall of the channel region. The insulating dielectric layer covers an outer side of the word line structure, an outer side of the first connection terminal, and an outer side of the second connection terminal. The capacitor structure covers an outer side of the insulating dielectric layer, a top surface of the insulating dielectric layer and a top surface of the second connection terminal, and the capacitor structure is electrically connected to the second connection terminal.

In one embodiment, the word line structure includes a word line dielectric layer and a word line conductive layer positioned on an outer side of the word line dielectric layer.

In one embodiment, the insulating dielectric layer includes a connection terminal dielectric layer and a word line structure insulating layer, wherein the connection terminal dielectric layer covers the first connection terminal and the second connection terminal, and the word line structure insulating layer covers the word line structure.

In one embodiment, the capacitor structure includes a top electrode, a bottom electrode, and a capacitor dielectric layer. The bottom electrode covers the outer side of the insulating dielectric layer, the top surface of the insulating dielectric layer and the top surface of the second connection terminal, and the bottom electrode is electrically connected to the second connection terminal. The capacitor dielectric layer covers a surface of the bottom electrode; and the top electrode covers a surface of the capacitor dielectric layer.

In one embodiment, the active region includes an indium gallium zinc oxide layer.

According to some embodiments, a second aspect of the present disclosure discloses a memory array structure, including: a plurality of memory cell structures provided in any one of the foregoing embodiments, wherein the plurality of memory cell structures are arranged in an array of multiple rows and multiple columns. The bit line structures of the plurality of memory cell structures positioned in the same row are electrically connected to each other; and the word line structures of the plurality of memory cell structures positioned in the same column are electrically connected to each other. The capacitor structures of the plurality of memory cell structures include top electrodes, capacitor dielectric layers and bottom electrodes stacked in sequence from top to bottom. The top electrodes of the capacitor structures are connected to each other, the capacitor dielectric layers of the capacitor structures are connected to each other, and the bottom electrodes of the capacitor structures are separated from each other by the capacitor dielectric layers.

In one embodiment, an active region dielectric layer is included between the plurality of memory cell structures positioned in the same column, and the active regions of the plurality of memory cell structures in the same column are separated from each other by the active region dielectric layer.

According to some embodiments, a third aspect of the present disclosure discloses a semiconductor structure, including multiple layers of the memory array structures provided in any one of the foregoing embodiments. The memory array structures of each layer are stacked from top to bottom, and an isolation layer is provided between adjacent two of the memory array structures. The word line structures, the bit line structures and the capacitor structures between the memory array structures of each layer are independent of each other.

According to some embodiments, a fourth aspect of the present disclosure discloses a method for manufacturing a memory array structure. The method includes: providing a substrate; forming a plurality of bit line structures extending along a first direction in the substrate; forming active regions arranged at an interval on the substrate, the active regions being positioned on the plurality of bit line structures, and in a direction perpendicular to the substrate, the active region including a first connection terminal, a second connection terminal away from the first connection terminal, and a channel region positioned between the first connection terminal and the second connection terminal, and the first connection terminal being electrically connected to the plurality of bit line structures; forming, between the active regions extending along a second direction, an active region dielectric layer configured to isolate the adjacent active regions in the second direction; forming an insulating dielectric layer on an outer side of the first connection terminal and of the second connection terminal exposed on the active region, and forming a word line structure on an outer side of the channel region exposed on the active region; and forming a capacitor structure, the capacitor structure covering an outer side of the insulating dielectric layer and covering a top surface of the insulating dielectric layer and a top surface of the second connection terminal, and the capacitor structure being electrically connected to the second connection terminal.

In one embodiment, the forming active regions arranged at an interval on the substrate includes: forming an active region material layer on an upper surface of the substrate; forming, in the active region material layer, a plurality of active region dielectric layers extending along the first direction and arranged at an interval, the active region dielectric layers being positioned between the plurality of adjacent bit line structures; and forming, in the active region material layer, a plurality of isolation trenches extending along the second direction and arranged at an interval, the plurality of isolation trenches being configured to disconnect the active region material layer and the plurality of active region dielectric layers along the second direction. The plurality of isolation trenches are exposed on a part of upper surfaces of the plurality of bit line structures; and the active regions are formed in the active region material layer between the plurality of adjacent isolation trenches.

In one embodiment, the forming an insulating dielectric layer on an outer side of the first connection terminal and of the second connection terminal exposed on the active region, and forming a word line structure on an outer side of the channel region exposed on the active region include: forming a connection terminal dielectric layer on two opposite sides of the active region, wherein the connection terminal dielectric layer covers a sidewall of the first connection terminal, a sidewall of the second connection terminal, and a sidewall of the channel region; forming the word line structure in a middle of the connection terminal dielectric layer such that the word line structure covers the sidewall of the channel region; and forming a word line structure insulating layer to cover an outer side of the word line structure, wherein the word line structure insulating layer and the connection terminal dielectric layer together constitute the insulating dielectric layer.

In one embodiment, the forming the word line structure in a middle of the connection terminal dielectric layer such that the word line structure covers the sidewall of the channel region includes: forming a sacrificial layer filling up the plurality of isolation trenches; removing a part of the connection terminal dielectric layer to expose the second connection terminal and the channel region of the active region; forming a word line dielectric layer to cover at least the sidewall of the channel region, a thickness of the word line dielectric layer being smaller than a thickness of the connection terminal dielectric layer; forming a word line conductive layer on an outer side of the word line dielectric layer, a top of the word line conductive layer being lower than a top of the active region; and forming the connection terminal dielectric layer on the top of the word line conductive layer to cover a sidewall of the second connection terminal.

In one embodiment, after forming the word line structure insulating layer, the method also includes: forming a bit line structure insulating layer on a bottom of the plurality of isolation trenches to cover a part of the exposed upper surfaces of the plurality of bit line structures.

In one embodiment, the forming a capacitor structure includes: forming a bottom electrode material layer, the bottom electrode material layer covering an upper surface of the bit line structure insulating layer, the top surface of the second connection terminal, and the outer side and the top surface of the insulating dielectric layer; disconnecting the bottom electrode material layer along the first direction and the second direction respectively to obtain a plurality of bottom electrodes arranged in an array, the plurality of bottom electrodes being in one-to-one correspondence with the active regions; forming a capacitor dielectric layer to cover a surface of the structure obtained; and forming a top electrode, wherein the top electrode covers a surface of the capacitor dielectric layer and fills up the plurality of isolation trenches.

According to some embodiments, a fifth aspect of the present disclosure discloses a method for manufacturing a semiconductor structure. The method includes: manufacturing a plurality of memory array structures by means of the method provided by any one of the foregoing embodiments; and stacking the plurality of memory array structures in sequence from bottom to top, to obtain a semiconductor structure having a multi-layered memory array structure.

The embodiments of the present disclosure may/at least have following advantages.

Each of the plurality of memory cell structures has a ring-trench capacitor structure, and the capacitor structure covers the outer side of the active region and the outer side the word line structure, which reduces an occupied area and a height for each of the plurality of memory cell structures, increases a size of each of the plurality of memory cell structures, and reduces difficulty of manufacturing processes. Because the height of a single memory cell structure is reduced, when a multi-layered memory structure is manufactured by means of the plurality of memory cell structures, density of the memory structure can be increased.

For example, the active region may be manufactured by means of an indium gallium zinc oxide (IGZO) layer. Compared to conventional active region materials, the IGZO can drive larger current and can write faster. Furthermore, when they are disabled, a leakage current is lower, which allows bit duration to be longer.

The above-mentioned memory array structure includes a plurality of memory cell structures in the foregoing embodiments. By means of a ring-trench capacitor structure, the memory array structure has a lower layer height, and number of stacked layers can be increased when stacking the multi-layered memory array structures, thereby increasing the density of the plurality of memory cell structures.

The above semiconductor structure has multi-layered memory array structures, the height of a single-layered memory array structure is reduced by means of the ring-trench capacitor structure, such that the number of stacked layers can be increased, thereby increasing the memory density.

By means of the above method for manufacturing a memory array structure, the capacitor structure may be surrounded on the outer side of the active region and the outer side of the word line structure, which reduces the occupied area and the height for the single memory cell structure and increases the memory density. In addition, a size of the memory array structure may be increased, and difficulty of manufacturing processes may be reduced.

Details of one or more embodiments of the present disclosure are set forth in the following drawings and descriptions. Other features, objectives and advantages of the present disclosure will become apparent from the specification, the drawings and the claims.

BRIEF DESCRIPTION OF THE DRAWINGS

To describe the technical solutions of the embodiments of the present disclosure more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

FIG. 10b is a schematic cross-sectional structural diagram along a direction AA' in FIG. 10a; and FIG. 10c is a schematic cross-sectional structural diagram along a direction of BB' in FIG. 10a;

DETAILED DESCRIPTION

For ease of understanding the present disclosure, the present disclosure will be described more fully hereinafter with reference to the accompanying drawings. Some embodiments of the present disclosure are provided in the accompanying drawings. The present disclosure may, however, be embodied in many different forms and should not be limited to the embodiments set forth herein. Rather, these embodiments are provided such that disclosed contents of the present disclosure are understood more thoroughly and completely.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure. As used herein, the term "and/or" includes any and all combinations of one or more of the associated listed items.

When describing a positional relationship, unless otherwise specified, when an element such as a layer or base substrate is referred to as being "on" another film layer, it can be directly on the other film layer or an intervening film layer may also be present. Further, when a layer is referred to as being "under" another layer, it can be directly under the other layer, or one or more intervening layers may also be present. It is also to be understood that when a layer is referred to as being "between" two layers, it can be the only one between the two layers, or one or more intervening layers may also be present. The term "on" and "under" in the present disclosure refers to a degree of proximity of a haptic feedback module to a user in an application process, wherein a side relatively close to the user is "on", and a side relatively far from the user is "under".

In the case of "comprising", "having", and "including" as described herein, another component may also be added unless a clearly defined term is used, such as "only", "consisting of", etc. Unless mentioned to the contrary, terms in the singular form may include the plural form and cannot be understood as one in number.

In the description of the present disclosure, it is to be noted that unless specified or limited otherwise, terms "connecting" or "connection" should be understood in a broad sense, which may be, for example, a fixed connection, a detachable connection or integrated connection, a direct connection or an indirect connection by means of an intermediary, or internal communication between two components. For those of ordinary skill in the art, meanings of the above terms in the present disclosure may be understood based on circumstances.

In addition, in the description of the present disclosure, unless otherwise specified, "a plurality of", "mutually", "superimposed", "stacked" and "several" mean two or more.

Figure 1:
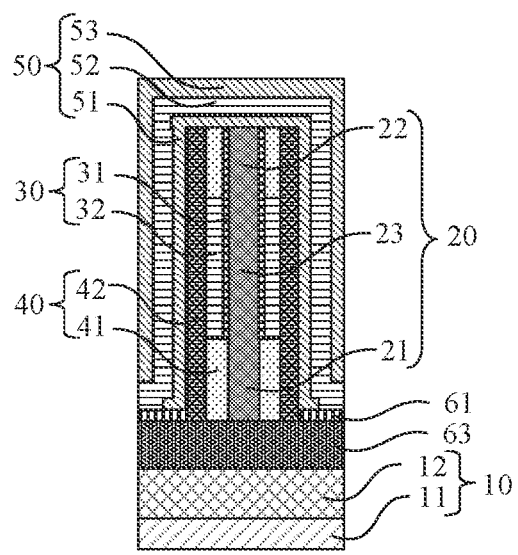
FIG. 1 is a schematic cross-sectional structural diagram of a memory cell structure according to an embodiment of the present disclosure.

As shown in FIG. 1, one embodiment of the present disclosure discloses a memory cell structure, including: a substrate 10 having a bit line structure 63 therein; an active region 20 positioned on the bit line structure 63, in a direction perpendicular to the substrate 10, the active region 20 including a first connection terminal 21, a second connection terminal 22 away from the first connection terminal 21, and a channel region 23 positioned between the first connection terminal 21 and the second connection terminal 22, the first connection terminal 21 being electrically connected to the bit line structure 63; a word line structure 30, in the direction perpendicular to the substrate 10, the word line structure 30 covering a sidewall of the channel region 23; an insulating dielectric layer 40, the insulating dielectric layer 40 covering an outer side of the word line structure 30, an outer side of the first connection terminal 21, and an outer side of the second connection terminal 22; and a capacitor structure 50, the capacitor structure 50 covering an outer side of the insulating dielectric layer 40, a top surface of the insulating dielectric layer 40, and a top surface of the second connection terminal 22, the capacitor structure 50 being electrically connected to the second connection terminal 22.

For example, the substrate 10 may include a base substrate 11 and a base substrate dielectric layer 12 positioned on a surface of the base substrate 11, wherein the base substrate 11 may include, but is not limited to, a silicon substrate, a silicon carbide substrate or other base substrates. The base substrate dielectric layer 12 may include, but is not limited to, a silicon oxide layer. The bit line structure 63 is positioned in the base substrate dielectric layer 12.

The active region 20 is positioned on the bit line structure 63, and is in contact with an upper surface of the bit line structure 63, and extends in the direction perpendicular to the substrate 10. The active region 20 includes the first connection terminal 21, the second connection terminal 22 away from the first connection terminal 21, and the channel region 23 positioned between the first connection terminal 21 and the second connection terminal 22, wherein the first connection terminal 21 is electrically connected to the bit line structure 63. For example, the active region 20 may include, but is not limited to, an indium gallium zinc oxide (IGZO) layer. Compared to conventional active region materials, the IGZO can drive larger current and can write faster. Furthermore, when they are disabled, a leakage current is lower, which allows bit duration to be longer.

In the direction perpendicular to the substrate 10, the word line structure 30 covers the sidewall of the channel region 23. For example, the word line structure 30 may include a word line dielectric layer 31 and a word line conductive layer 32 positioned on an outer side of the word line dielectric layer 31. The word line dielectric layer 31 may be a gate oxide layer, such as a silicon oxide layer. In some embodiments, the word line dielectric layer 31 may only cover an outer side of the channel region 23, or may cover the outer side of the channel region 23 and the outer side of the second connection terminal 22. The word line conductive layer 32 may be a metal layer (e.g., a metal copper), and is positioned on the outer side the word line dielectric layer 31 and is corresponding to a location of the channel region 23.

The insulating dielectric layer 40 covers the outer side of the word line structure 30, the outer side of the first connection terminal 21, and the outer side of the second connection terminal 22. For example, the insulating dielectric layer 40 may include a connection terminal dielectric layer 41 and a word line structure insulating layer 42. For example, the connection terminal dielectric layer 41 covers the outer side of the first connection terminal 21 and the outer side of the second connection terminal 22. The word line structure insulating layer 42 covers at least the outer side of the word line conductive layer 32. In some embodiments, as shown in FIG. 1, the word line structure insulating layer 42 may also cover the outer side of the connection terminal dielectric layer 41. As an example, the connection terminal dielectric layer 41 may be a silicon nitride layer, and the word line structure insulating layer 42 may be a silicon oxide layer.

The capacitor structure 50 covers the outer side of the insulating dielectric layer 40, and covers the top surface of the insulating dielectric layer 40 and the top surface of the second connection terminal 22, and the capacitor structure 50 is electrically connected to the second connection terminal 22. As shown in FIG. 1, a bit line structure insulating layer 61 is also included between the capacitor structure 50 and the substrate 10 to separate the capacitor structure 50 from the bit line structure 63. By applying a high level to the word line conductive layer 32, a current may be formed in the channel region 23, such that the capacitor structure 50 is electrically connected to the bit line structure 63 by means of the active region 20. In this way, data may be read from the capacitor structure 50, or data may be written into the capacitor structure 50.

For example, as shown in FIG. 1, the capacitor structure includes 50 a top electrode 53, a bottom electrode 51, and a capacitor dielectric layer 52. The bottom electrode 51 covers the outer side of the insulating dielectric layer 40, the top surface of the insulating dielectric layer 40 and the top surface of the second connection terminal 22, and the bottom electrode 51 is electrically connected to the second connection terminal 22. The capacitor dielectric layer 52 covers a surface of the bottom electrode 51, and the top electrode 53 covers a surface of the capacitor dielectric layer 52.

For example, the above-mentioned memory cell structure may be a DRAM memory cell structure.

Each of the plurality of memory cell structures has a ring-trench capacitor structure, and the capacitor structure covers the outer side of the active region and the outer side the word line structure, which reduces an occupied area and a height for each of the plurality of memory cell structures, increases a size of each of the plurality of memory cell structures, and reduces difficulty of manufacturing processes. Because the height of a single memory cell structure is reduced, when a multi-layered memory structure is manufactured by means of the plurality of memory cell structures, density of the memory structure can be increased.

Figure 2:
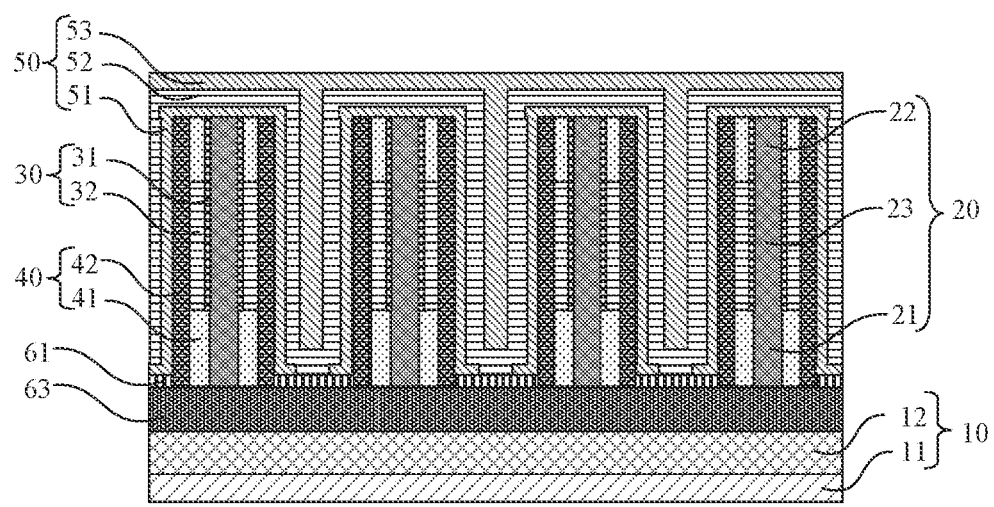
FIG. 2 is a schematic cross-sectional structural diagram of a memory array structure according to an embodiment of the present disclosure.

As shown in FIG. 2, one embodiment of the present disclosure also discloses a memory array structure, including: a plurality of memory cell structures provided in any one of the foregoing embodiments, wherein the plurality of memory cell structures are arranged in an array of multiple rows and multiple columns. The bit line structures 63 of the plurality of memory cell structures positioned in the same row are electrically connected to each other; and the word line structures 30 of the plurality of memory cell structures positioned in the same column are electrically connected to each other. The capacitor structures 50 of the plurality of memory cell structures include top electrodes 53, capacitor dielectric layers 52 and bottom electrodes 51 stacked in sequence from top to bottom. The top electrodes 53 of the capacitor structures 50 are connected to each other, the capacitor dielectric layers 52 of the capacitor structures 50 are connected to each other, and the bottom electrodes 51 of the capacitor structures 50 are separated from each other by the capacitor dielectric layers 52.

The bit line structures 63 of the plurality of memory cell structures positioned in the same row are electrically connected to each other and extend along a first direction, which is a row direction of the memory array structure. For example, as shown in FIG. 2, the memory array structure also includes a bit line structure insulating layer 61 positioned on the upper surface of the bit line structure 63 to separate the capacitor structure 50 from the bit line structure 63.

The word line structures 30 of the plurality of memory cell structures positioned in the same column are electrically connected to each other and extend along a second direction, which is a column direction of the memory array structure. For example, an active region dielectric layer (not shown in the figure) is also included between the plurality of memory cell structures positioned in the same column, and the active regions 20 of the plurality of memory cell structures in the same column are separated from each other by the active region dielectric layers. The active region dielectric layers and the active regions 20 are alternately arranged in the second direction.

The capacitor structures 50 of the plurality of memory cell structures include top electrodes 53, capacitor dielectric layers 52 and bottom electrodes 51 stacked in sequence from top to bottom. The top electrodes 53 of the capacitor structures 50 are connected to each other, the capacitor dielectric layers 52 of the capacitor structures 50 are connected to each other, and the bottom electrodes 51 of the capacitor structures 50 are separated from each other by the capacitor dielectric layers 52. In this way, the plurality of memory cell structures independent of each other are formed.

The above-mentioned memory array structure includes a plurality of memory cell structures arranged in an array. By means of the ring-trench capacitor structure, the memory array structure has a lower layer height, and the number of stacked layers can be increased when stacking the multi-layered memory array structures, thereby increasing the density of the plurality of memory cell structures.

One embodiment of the present disclosure also discloses a semiconductor structure, including multiple layers of the memory array structures provided in any one of the foregoing embodiments. The memory array structures of each layer are stacked from top to bottom, and an isolation layer is provided between adjacent two of the memory array structures. The word line structures 30, the bit line structures 63 and the capacitor structures 50 between the memory array structures of each layer are independent of each other.

Figure 3:
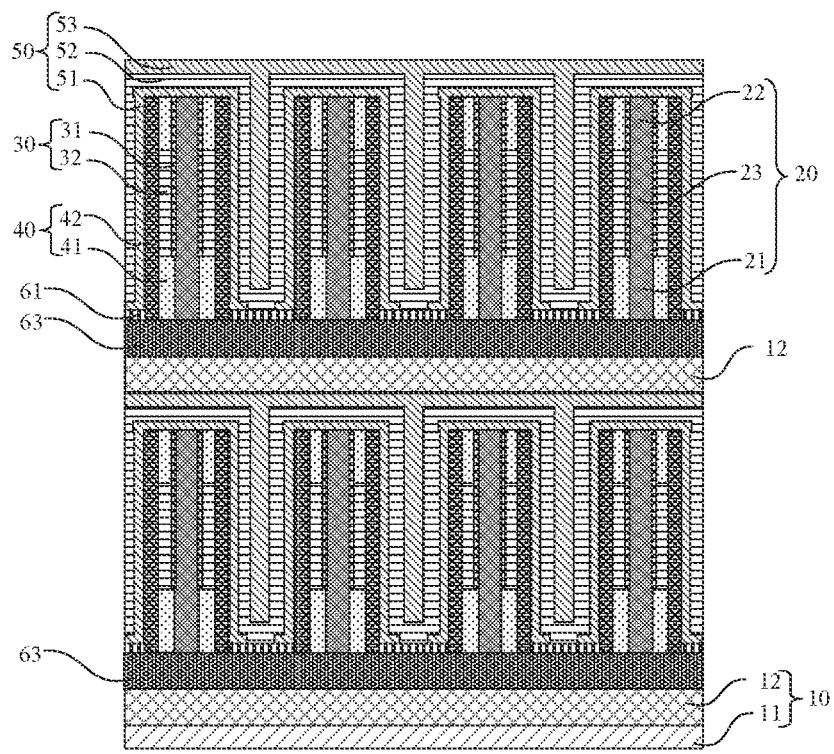
FIG. 3 is a schematic cross-sectional structural diagram of a semiconductor structure according to an embodiment of the present disclosure.

For example, FIG. 3 illustrates a semiconductor structure having a two-layered memory array structure. The base substrate dielectric layer 12 of the memory array structures of each layer includes bit line structures 63 arranged in parallel at an interval. Reference may be made to the foregoing embodiments for arrangement and connection modes of the bit line structures 63, the word line structures 30 and the capacitor structures 50, which are not to be described here. For example, number of layers of the memory array structure may be increased as required.

The above semiconductor structure has multi-layered memory array structures. By means of the ring-trench capacitor structure, the height of the single-layered memory array structure is reduced, such that the number of stacked layers can be larger, thereby increasing the memory density.

Figure 4:
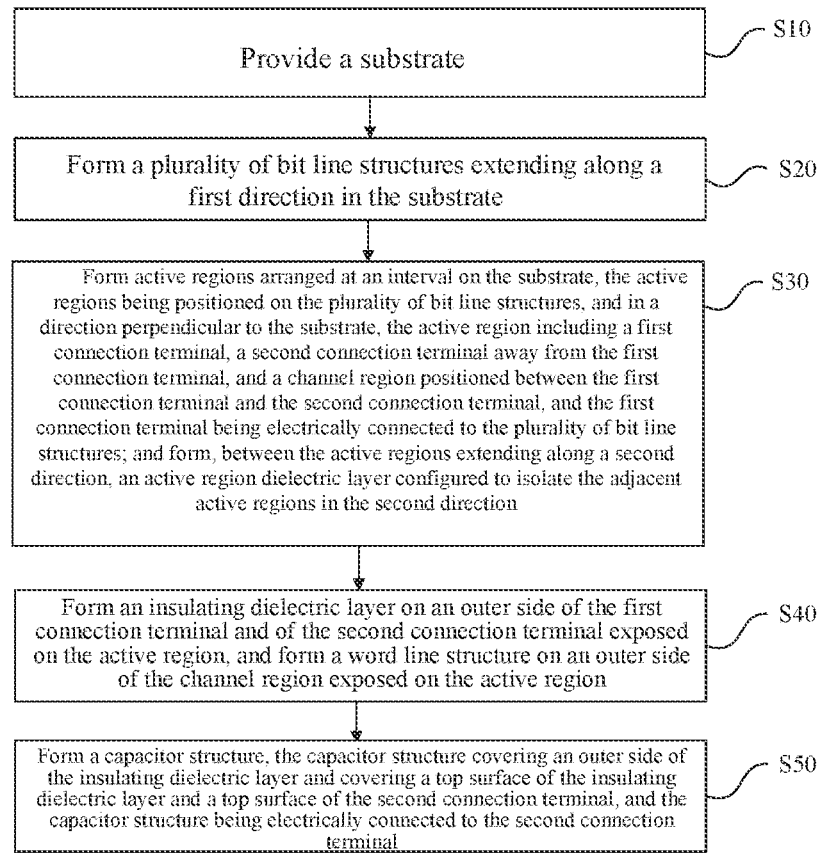
FIG. 4 is a flow block diagram of a method for manufacturing a memory array structure according to an embodiment of the present disclosure.

As shown in FIG. 4, one embodiment of the present disclosure provides a method for manufacturing a memory array structure. The method includes:

S10: providing a substrate;

S20: forming a plurality of bit line structures extending along a first direction in the substrate;

S30: forming active regions arranged at an interval on the substrate, the active regions being positioned on the plurality of bit line structures, and in a direction perpendicular to the substrate, the active region including a first connection terminal, a second connection terminal away from the first connection terminal, and a channel region positioned between the first connection terminal and the second connection terminal, and the first connection terminal being electrically connected to the plurality of bit line structures; and forming, between the active regions extending along a second direction, an active region dielectric layer configured to isolate the adjacent active regions in the second direction;

S40: forming an insulating dielectric layer on an outer side of the first connection terminal and of the second connection terminal exposed on the active region, and forming a word line structure on an outer side of the channel region exposed on the active region; and S50: forming a capacitor structure, the capacitor structure covering an outer side of the insulating dielectric layer and covering a top surface of the insulating dielectric layer and a top surface of the second connection terminal, and the capacitor structure being electrically connected to the second connection terminal.

By means of the above method for manufacturing a memory array structure, the capacitor structure may be covered on the outer side of the active region and the outer side of the word line structure, which reduces an occupied area and a height for a single memory cell structure and increases memory density. In addition, a size of the memory array structure may be increased, and difficulty of manufacturing processes may be reduced.

Figure 5:
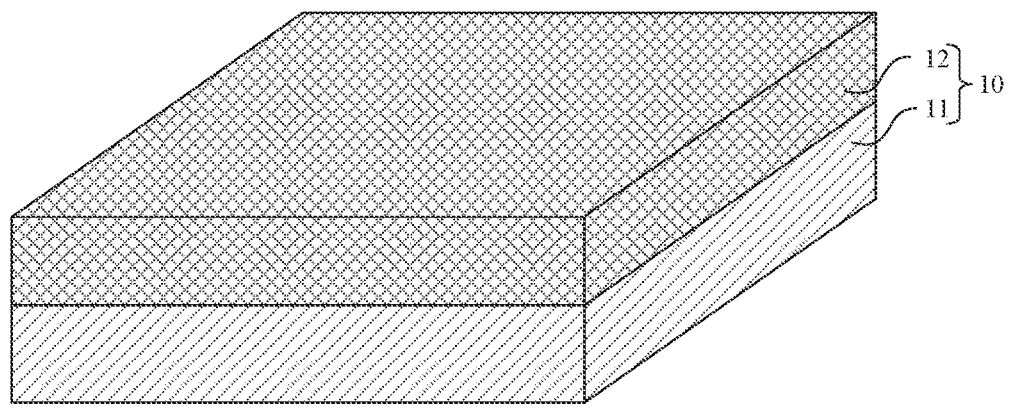
FIG. 5 is a schematic three-dimensional structural diagram of a substrate according to an embodiment of the present disclosure.

For example, in Step S10, referring to Step S10 in FIG. 4 and to FIG. 5, the provided substrate 10 may include a base substrate 11 and a base substrate dielectric layer 12 on a surface of the base substrate 11, as shown in FIG. 5. The base substrate 11 may include, but is not limited to, a silicon substrate 11, a silicon carbide substrate 11 or other base substrates 11. The base substrate dielectric layer 12 may include, but is not limited to, a silicon oxide layer.

Figure 6:
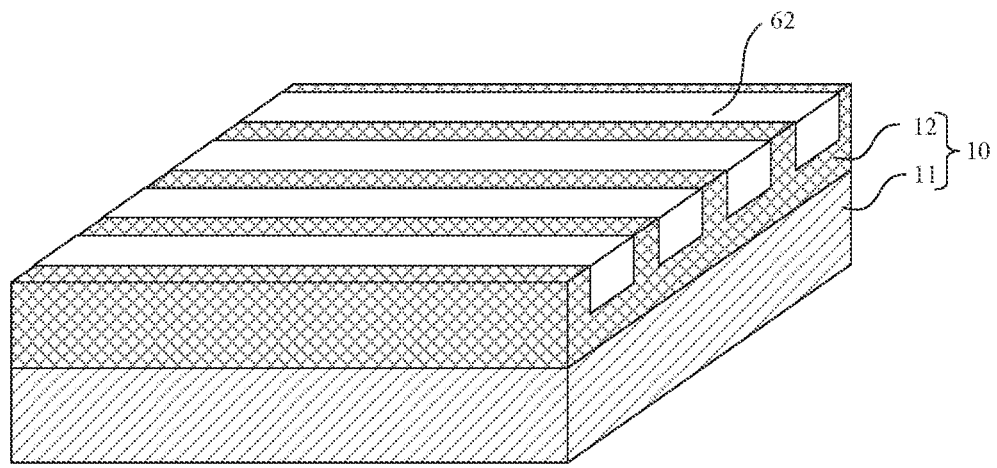
FIG. 6 is a schematic three-dimensional structural diagram after forming a bit line trench according to an embodiment of the present disclosure.
Figure 7:
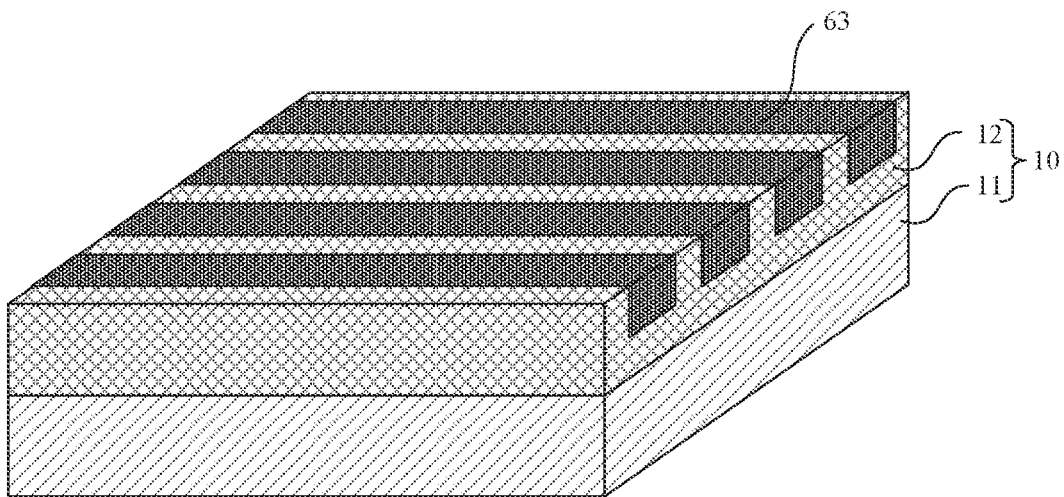
FIG. 7 is a schematic three-dimensional structural diagram after forming a bit line structure according to an embodiment of the present disclosure.

In Step S20, referring to Step S20 in FIG. 4 to and FIGS. 6 to 7, a plurality of bit line structures 63 extending along the first direction are formed in the substrate 10.

For example, as shown in FIG. 6, the base substrate dielectric layer 12 may be etched first to form bit line trenches 62 extending in the first direction in the base substrate dielectric layer 12, wherein the bit line trenches 62 are arranged in parallel at an interval. The process of forming the bit line trench 62 may be a dry etching process or a wet etching process.

After the bit line trench 62 is formed, a metal layer is deposited in the bit line trench 62 to form the bit line structure 63. In some embodiments, the top surface of the bit line structure 63 is flush with the top surface of the substrate 10, as shown in FIG. 7. A material for forming the metal layer may include, but is not limited to, metallic copper.

In Step S30, referring to Step S30 in FIG. 4 and to FIGS. 8 to 17, the step of forming active regions 20 arranged at an interval on the substrate 10 includes following steps.

Figure 8:
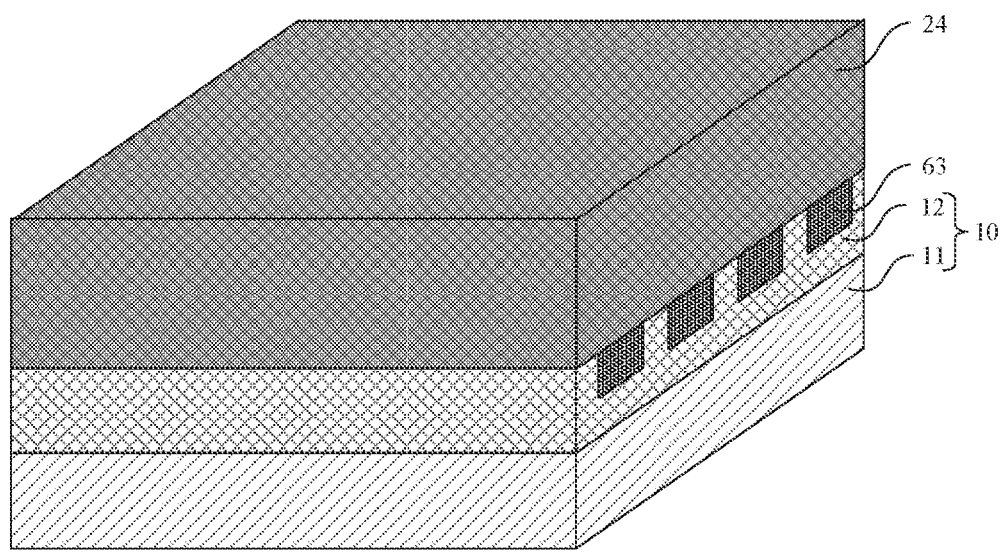
FIG. 8 is a schematic three-dimensional structural diagram after forming an active region material layer according to an embodiment of the present disclosure.

Step S31: forming an active region material layer 24 on an upper surface of the substrate 10, as shown in FIG. 8.

For example, an indium gallium zinc oxide (IGZO) layer may be deposited on the surface of the substrate 10 to serve as the active region material layer 24. Compared to conventional active region materials, the IGZO can drive larger current and can write faster. Furthermore, when they are disabled, a leakage current is lower, which allows bit duration to be longer.

Figure 9:
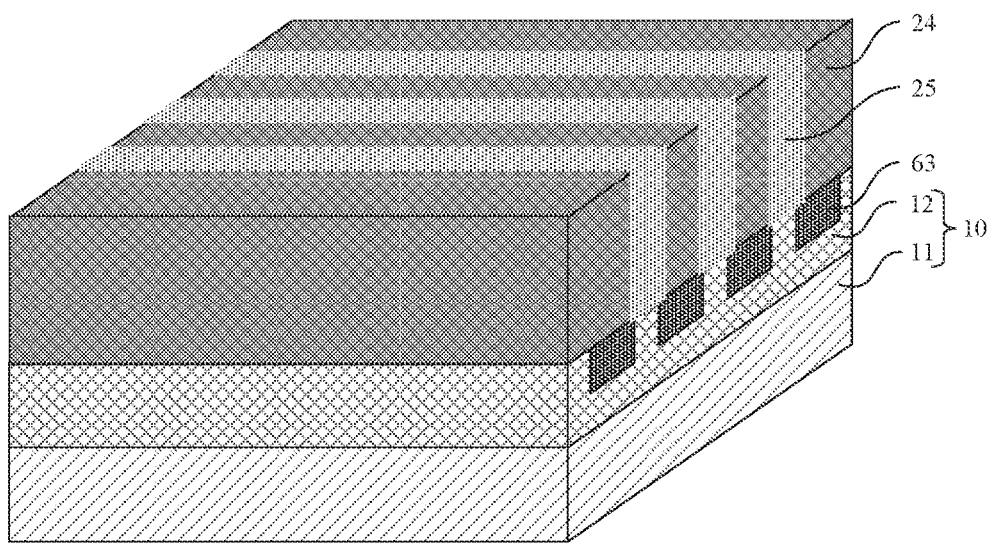
FIG. 9 is a schematic three-dimensional structural diagram after forming an active region dielectric layer according to an embodiment of the present disclosure.

Step S32: forming, in the active region material layer 24, a plurality of active region dielectric layers 25 extending along the first direction and arranged at an interval, the plurality of active region dielectric layers 25 being positioned between the plurality of adjacent bit line structures 63, as shown in FIG. 9.

For example, a plurality of shallow trench isolation structures arranged in parallel at an interval may be first formed in the active region material layer 24 along the first direction, and then a silicon oxide layer may be filled in the plurality of shallow trench isolation structures to form the plurality of active region dielectric layers 25. The plurality of active region dielectric layers 25 are positioned between the plurality of adjacent bit line structures 63. In some embodiments, a width of each of the plurality of active region dielectric layers 25 is equal to a gap width between the plurality of bit line structures 63.

Figure 10A:
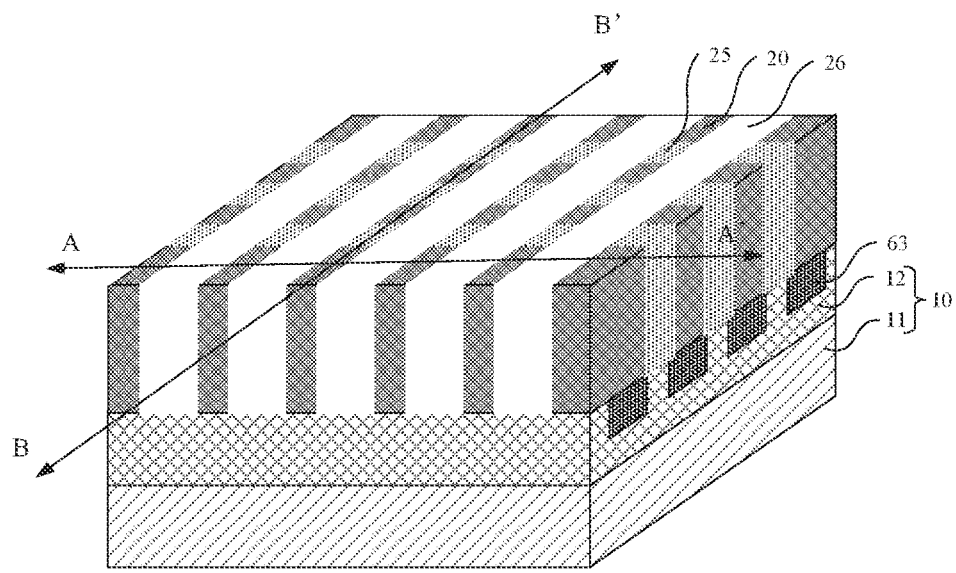
FIG. 10a is a schematic three-dimensional structural diagram after forming an isolation trench according to an embodiment of the present disclosure.
Figure 10B:
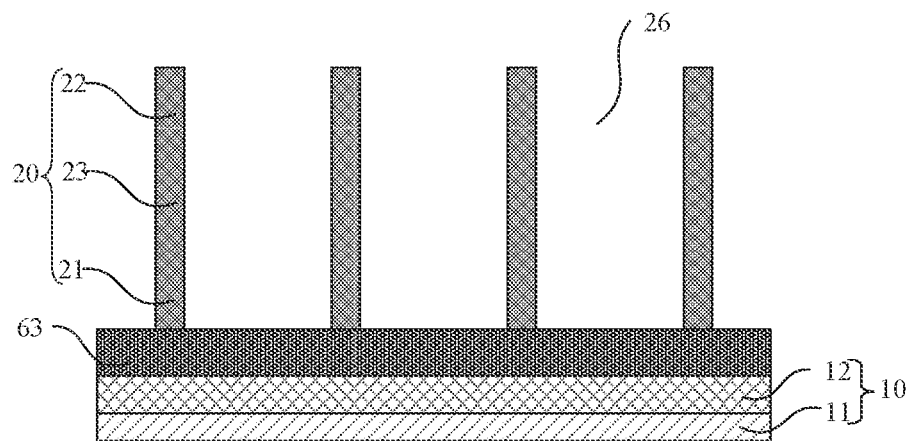
Figure 10C:
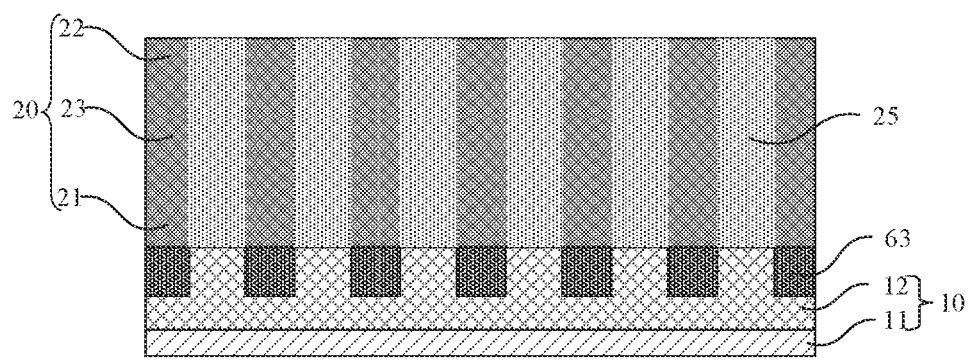

Step S33: forming, in the active region material layer 24, a plurality of isolation trenches 26 extending along the second direction and arranged at an interval, the plurality of isolation trenches 26 being configured to disconnect the active region material layer 24 and the plurality of active region dielectric layers 25 along the second direction; wherein the plurality of isolation trenches 26 are exposed on a part of upper surfaces of the plurality of bit line structures 63; and the active regions 20 being formed in the active region material layer between the plurality of adjacent isolation trenches 26, as shown in FIG. 10A, FIG. 10B, and FIG. 10C.

FIG. 10B is a schematic cross-sectional diagram of the structure shown in FIG. 10A along a direction AA' (first direction); and FIG. 10C is a schematic cross-sectional diagram of the structure shown in FIG. 10A along a direction BB' (second direction). For example, a plurality of isolation trenches 26 arranged at an interval may be formed in the active region material layer 24 along the second direction by means of an etching process, and the plurality of isolation trenches 26 disconnect the active region material layers 24 and the active region dielectric layers 25 along the second direction, as shown in FIG. 10A. The plurality of isolation trenches 26 are exposed on a part of the upper surfaces of the bit line structure 63, as shown in FIG. 10B. The active regions 20 are formed in the active region material layer 24 between the adjacent isolation trenches 26, and the active regions 20 and the active region dielectric layers 25 are alternately arranged in the second direction, as shown in FIG. 10C. The active region 20 includes a first connection terminal 21, a second connection terminal 22 away from the first connection terminal 21, and a channel region 23 positioned between the first connection terminal 21 and the second connection terminal 22.

In Step S40, referring to Step S40 in FIG. 4 and to FIGS. 11 to 17, the step of forming the insulating dielectric layer and the word line structure may include following steps.

Figure 11:
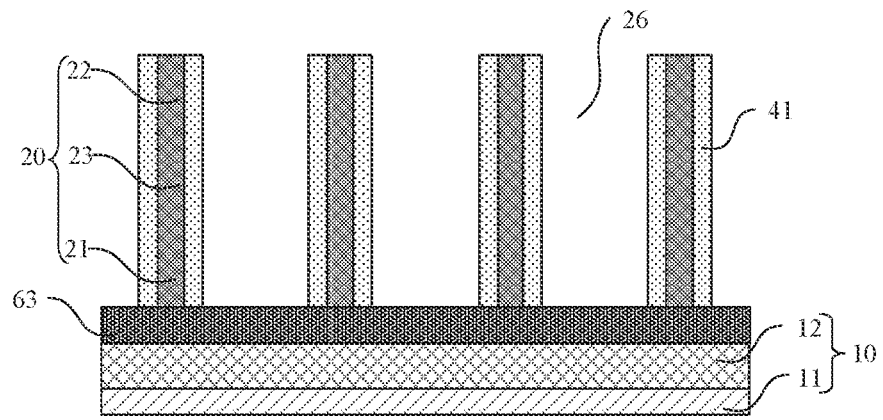
FIG. 11 is a schematic cross-sectional structural diagram after forming a connection terminal dielectric layer according to an embodiment of the present disclosure.

Step S41: forming a connection terminal dielectric layer 41 on two opposite sides of the active region 20, wherein the connection terminal dielectric layer 41 covers a sidewall of the first connection terminal 21, a sidewall of the second connection terminal 22, and a sidewall of the channel region, as shown in FIG. 11.

For example, a silicon nitride layer may be deposited on the sidewall of the active region 20 to form the connection terminal dielectric layer 41. In some embodiments, the top of the connection terminal dielectric layer 41 is flush with the top of the active region 20 to completely cover the sidewalls of the first connection terminal 21, the second connection terminal 22 and the channel region 23 of the active region 20. For example, the process of depositing the silicon nitride layer may include an atomic layer deposition process, a plasma deposition process, a chemical vapor deposition process, or a physical vapor deposition process.

Step S42: forming the word line structure 30 in a middle of the connection terminal dielectric layer 41 such that the word line structure 30 covers the sidewall of the channel region 23. For example, the step of forming a word line structure 30 includes following steps.

Figure 12:
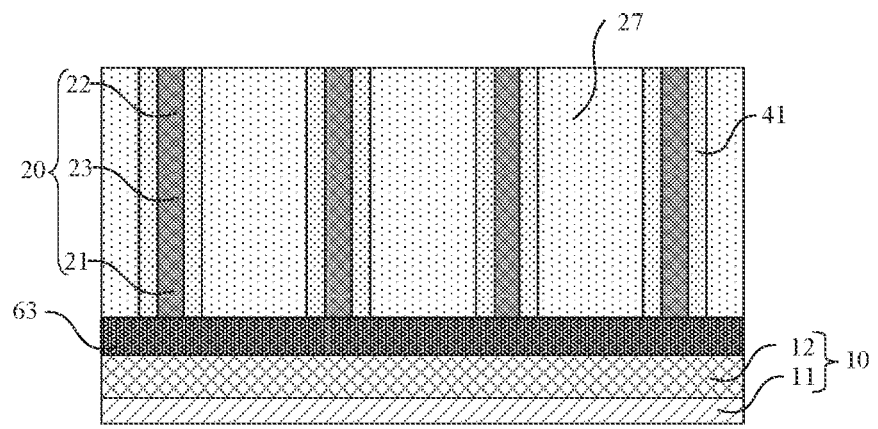
FIGS. 12 to 16 are schematic diagrams showing processes of forming a word line structure in the terminal dielectric layer according to an embodiment of the present disclosure.

Step S421: forming a sacrificial layer 27 filling up the plurality of isolation trenches 26, as shown in FIG. 12.

For example, a silicon oxide layer may be filled in the plurality of isolation trenches 26 to serve as the sacrificial layer 27, and a top of the silicon oxide layer is flush with the top of the active region 20.

Figure 13:
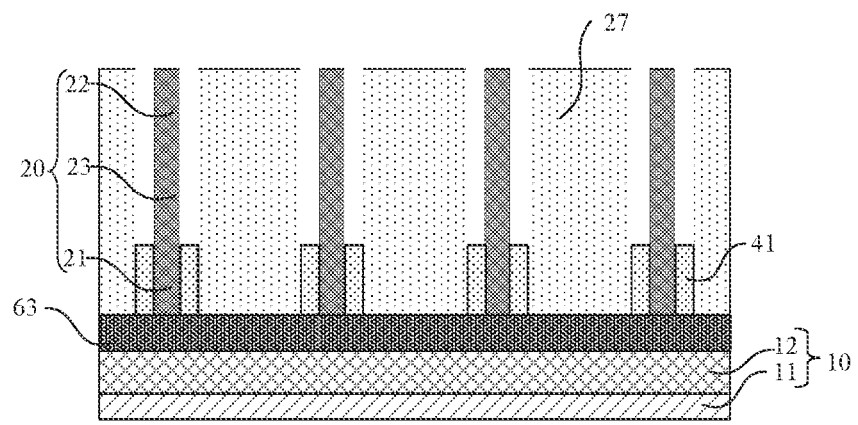

Step S422: removing a part of the connection terminal dielectric layer 41 to expose the second connection terminal 22 and the channel region 23 of the active region 20, as shown in FIG. 13.

For example, a gas with a higher etching selectivity to the silicon nitride layer may be selected to etch the connection terminal dielectric layer 41 to remove a part of the connection terminal dielectric layer 41, thereby obtaining the structure as shown in FIG. 13. In this way, the second connection terminal 22 and the channel region 23 of the active region 20 are exposed.

Figure 14:
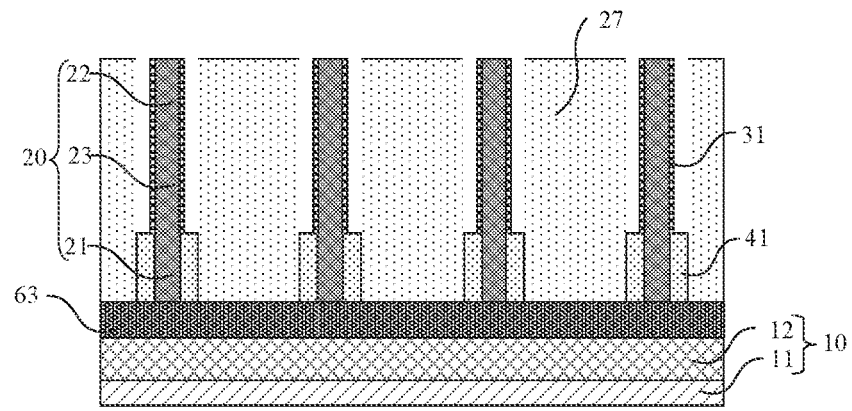

Step S423: forming a word line dielectric layer 31 to cover at least the sidewall of the channel region 23, wherein a thickness of the word line dielectric layer 31 is smaller than a thickness of the connection terminal dielectric layer 41, as shown in FIG. 14.

For example, a silicon oxide layer may be deposited on the sidewall of the channel region 23 by means of an atomic layer deposition (ALD) process to obtain the word line dielectric layer 31. The thickness of the word line dielectric layer 31 is smaller than that of the connection terminal dielectric layer 41. In some embodiments, the word line dielectric layer 31 may also concurrently cover the sidewall of the second connection terminal 22 and the sidewall of the channel region 23, wherein a top of the word line dielectric layer 31 is flush with that of the active region 20.

Figure 15:
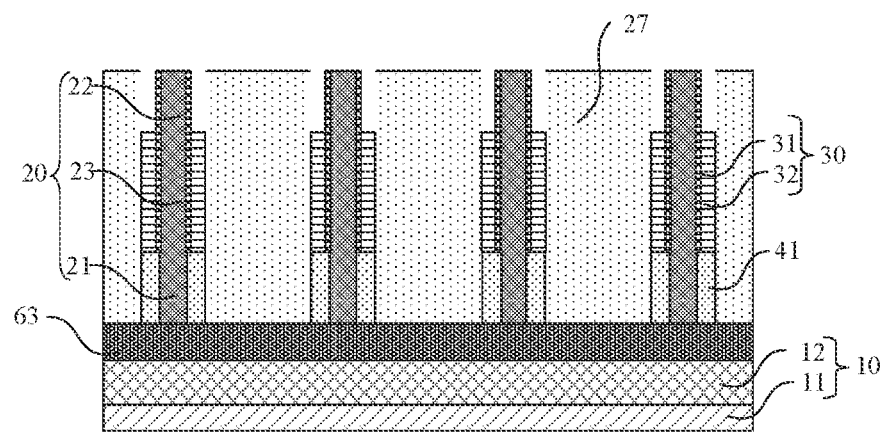

Step S424: forming a word line conductive layer 32 on an outer side of the word line dielectric layer 31, wherein a top of the word line conductive layer 32 is lower than that of the active region 20, as shown in FIG. 15.

For example, a metal or other conductive material may be deposited between the word line dielectric layer 31 and the sacrificial layer 27 to form the word line conductive layer 32. For example, the word line conductive layer 32 may be a copper layer. A bottom of the word line conductive layer 32 is in contact with the connection terminal dielectric layer 41, and the top of the word line conductive layer 32 is lower than that of the active region 20. The word line conductive layer 32 and the word line dielectric layer 31 together constitute the word line structure 30.

Figure 16:
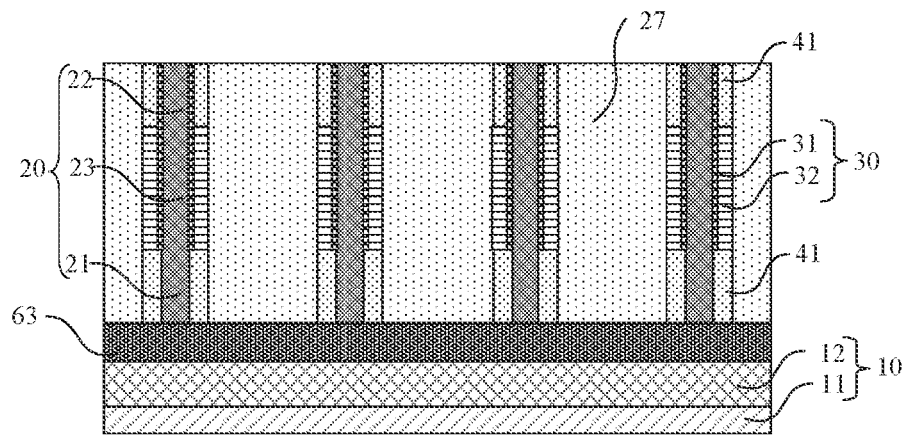

Step S425: forming the connection terminal dielectric layer 41 on the top of the word line conductive layer 32 to cover the sidewall of the second connection terminal 22, as shown in FIG. 16.

For example, a silicon nitride layer is deposited on the top of the word line conductive layer 32 to form the connection terminal dielectric layer 41 that is flush with the top of the active region 20, and the newly formed connection terminal dielectric layer 41 covers the second connection terminal 22 of the active region 20.

Figure 17:
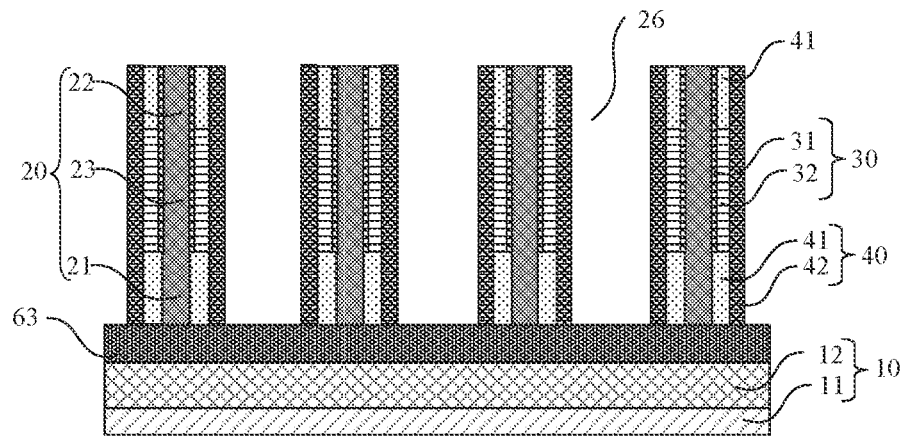
FIG. 17 is a schematic cross-sectional structural diagram after forming a word line structure insulating layer according to an embodiment of the present disclosure.

Step S43: forming a word line structure insulating layer 42 to cover an outer side of the word line structure 30, wherein the word line structure insulating layer 42 and the connection terminal dielectric layer 41 together constitute the insulating dielectric layer 40, as shown in FIG. 17.

For example, the sacrificial layer 27 may be removed first, and then an oxide layer may be deposited on an outer sidewall of the connection terminal dielectric layer 41 and an outer sidewall of the word line conductive layer 32 by means of the atomic layer deposition (ALD) to form the word line structure insulating layer 42. In some embodiments, a height of the word line structure insulating layer 42 is equal to that of the active region 20. The word line structure insulating layer 42 and the connection terminal dielectric layer 41 together constitute the insulating dielectric layer 40.

Figure 18:
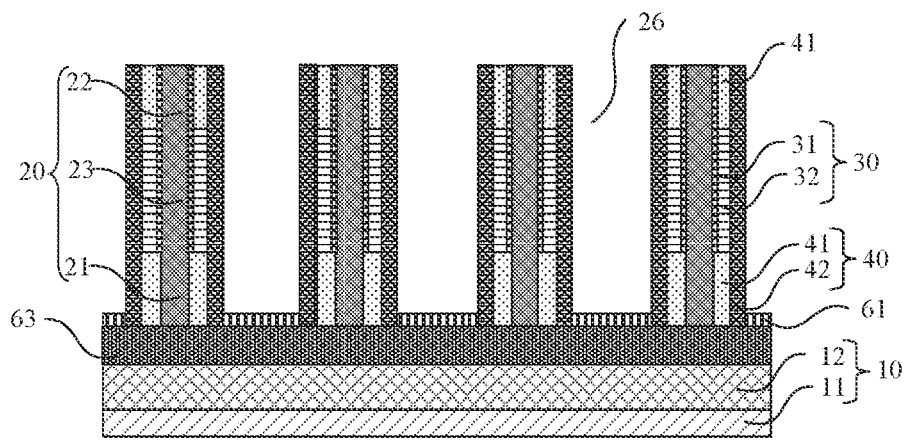
FIG. 18 is a schematic cross-sectional structural diagram after forming a word line structure insulating layer and a bit line structure insulating layer according to an embodiment of the present disclosure.

In one embodiment, after forming the word line structure insulating layer 42, the method also includes: forming a bit line structure insulating layer 61 on the bottom of the plurality of isolation trenches 26 to cover a part of the exposed upper surface of the bit line structure 63, as shown in FIG. 18.

For example, when forming the word line structure insulating layer 42, the oxide layer may be deposited on the bottom of the plurality of isolation trenches 26 to cover the exposed upper surface of the bit line structure 63 to form the bit line structure insulating layer 61.

In Step S50, referring to Step S50 in FIG. 4 and to FIGS. 19 to 24, the step of forming a capacitor structure 50 includes following steps.

Figure 19:
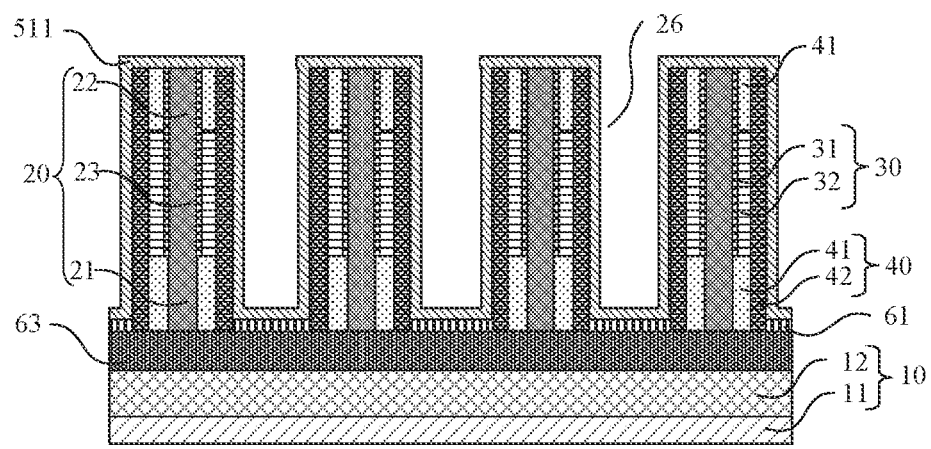
FIG. 19 is a schematic cross-sectional structural diagram after forming a bottom electrode material layer according to an embodiment of the present disclosure.

Step S51: forming a bottom electrode material layer 511, wherein the bottom electrode material layer 511 covers an upper surface of the bit line structure insulating layer 61, the top surface of the second connection terminal 22, and the outer side and the top surface of the insulating dielectric layer 40, as shown in FIG. 19.

For example, the bottom electrode material layer 511 may include, but is not limited to, a tungsten layer, a titanium nitride layer or other conductive layers.

Step S52: disconnecting the bottom electrode material layer 511 along the first direction and the second direction respectively to obtain a plurality of bottom electrodes 51 arranged in an array, wherein the plurality of bottom electrodes 51 are in one-to-one correspondence with the active regions 20. For example, the step of forming the bottom electrode 51 includes following steps.

Figure 20:
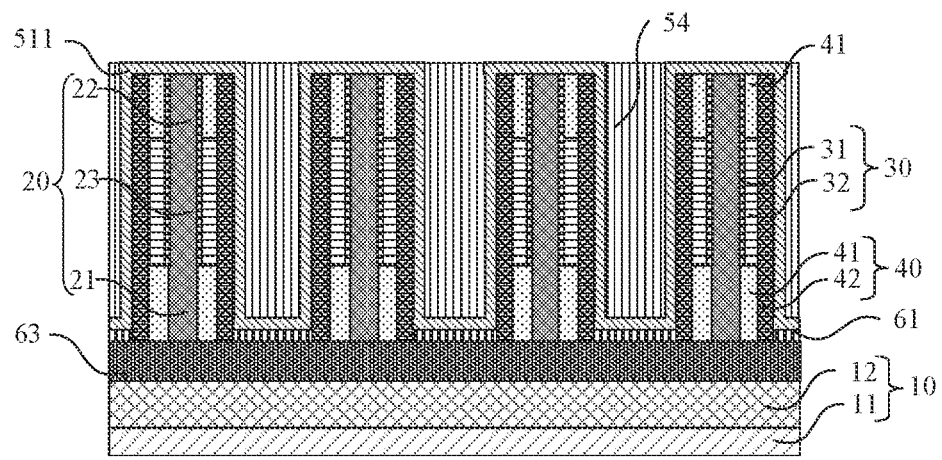
FIG. 20 is a schematic cross-sectional structural diagram after forming a mask layer according to an embodiment of the present disclosure.

Step S521: forming a mask layer 54 filling up the plurality of isolation trenches 26, as shown in FIG. 20.

For example, the mask layer 54 may be a silicon oxide layer or a silicon oxynitride layer. The mask layer 54 may be formed by means of the atomic layer deposition process, the plasma deposition process, the chemical vapor deposition process, or the physical vapor deposition process. In some embodiments, a top of mask layer 54 is flush with that of the bottom electrode material layer 511.

Step S522: forming a patterned photoresist layer 55 on an upper surface of the mask layer 54, and etching the bottom electrode material layer 511 based on the patterned photoresist layer 55.

Figure 21:
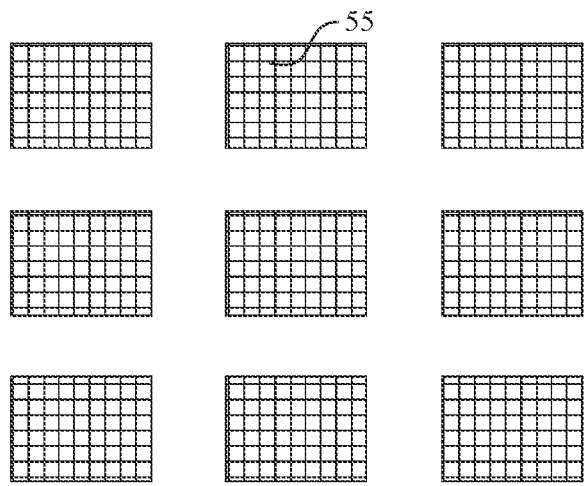
FIG. 21 is a vertical view of a patterned photoresist layer according to an embodiment of the present disclosure.
Figure 22:
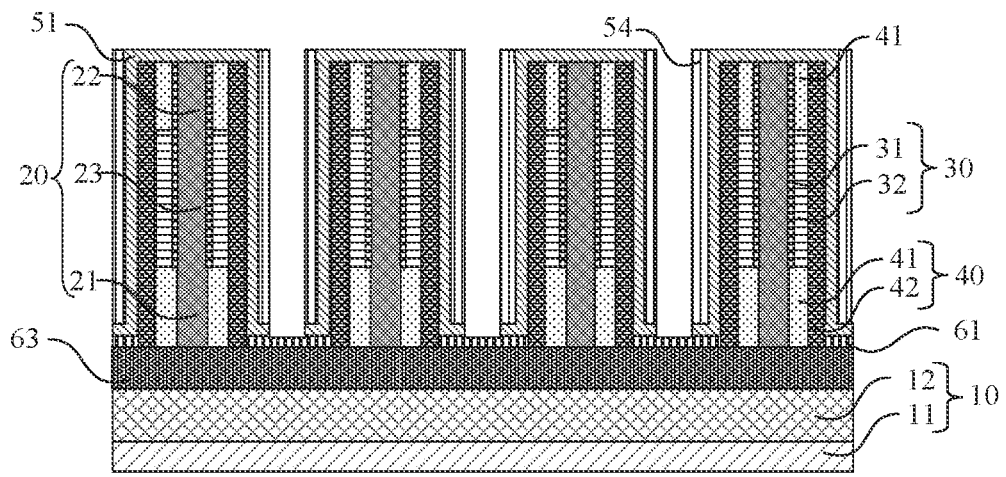
FIG. 22 is a schematic cross-sectional structural diagram of after etching a bottom electrode according to an embodiment of the present disclosure.

The patterned photoresist layer 55 may be configured to define a location where the bottom electrode material layer 511 needs to be disconnected. For example, a vertical view of the patterned photoresist layer 55 is shown in FIG. 21, and the bottom electrode material layer 511 is etched based on the patterned photoresist layer 55, such that the exposed bottom electrode material layer 511 of the patterned photoresist layer 55 is removed. From the first direction, a part of the bottom electrode material layer 511 on the bottom of the plurality of isolation trenches 26 is removed; and from the second direction, a part of the bottom electrode material layer 511 corresponding to a location of the active region dielectric layer 25 is removed (the location of the active region dielectric layer 25 may be referred to FIG. 10A), thereby forming the plurality of bottom electrodes 51 arranged in an array, as shown in FIG. 22.

Figure 23:
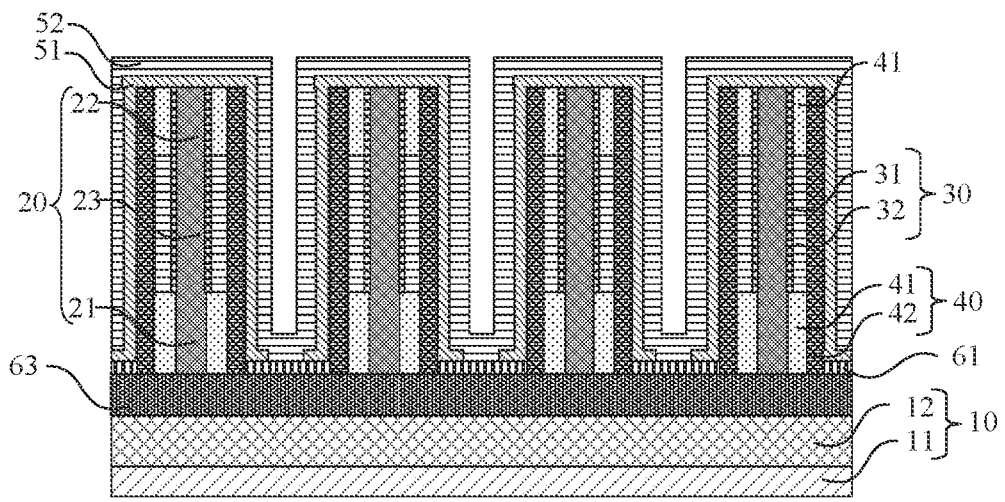
FIG. 23 is a schematic cross-sectional structural diagram after forming a capacitor dielectric layer according to an embodiment of the present disclosure.

Step S53: forming a capacitor dielectric layer 52 to cover a surface of the structure obtained, as shown in FIG. 23.

For example, the mask layer 54 may be completely removed first, and then the capacitor dielectric layer 52 is deposited on the upper surface of the structure obtained.

Figure 24:
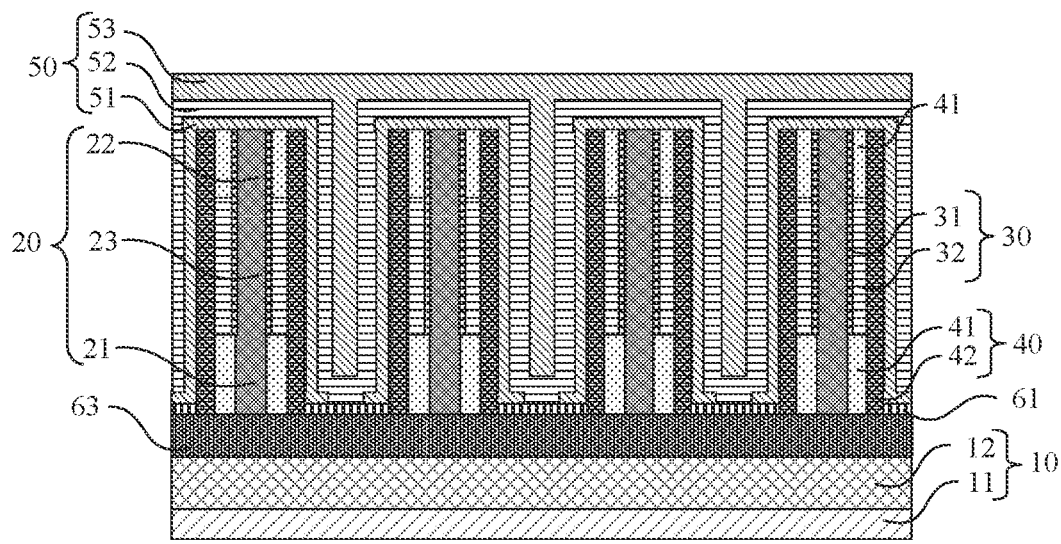
FIG. 24 is a schematic cross-sectional structural diagram after forming a top electrode according to an embodiment of the present disclosure.

Step S54: forming a top electrode 53, wherein the top electrode 53 covers a surface of the capacitor dielectric layer 52 and fills up the plurality of isolation trenches 26, as shown in FIG. 24.

For example, a material for forming the top electrode 53 may be the same as the bottom electrode material layer 511, for example, a tungsten layer, a titanium nitride layer or other conductive layers.

The present disclosure also discloses a method for manufacturing a semiconductor structure. The method includes: manufacturing a plurality of memory array structures by means of the method provided in any one of the foregoing embodiments; and stacking the plurality of memory array structures in sequence from bottom to top to obtain the semiconductor structure having a multi-layered memory array structure.

In some embodiments, an isolation layer is also provided between two adjacent layers of memory array structures. The word line structures 30, the bit line structures 63 and the capacitor structures 50 between the memory array structures of each layer are independent of each other.

By means of the above method for manufacturing a semiconductor structure, the layer height of a single-layered memory array structure can be reduced, the number of stacked layers can be increased, and thus the memory density can be increased.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the present disclosure shall be subject to the appended claims.

What is claimed is:

1. A memory cell structure, comprising:
   a substrate having a bit line structure therein;
   an active region positioned on the bit line structure, in a direction perpendicular to the substrate, the active region comprising a first connection terminal, a second connection terminal away from the first connection terminal, and a channel region positioned between the first connection terminal and the second connection terminal, the first connection terminal being electrically connected to the bit line structure;
   a word line structure, in the direction perpendicular to the substrate, the word line structure covering a sidewall of the channel region;
   an insulating dielectric layer covering an outer side of the word line structure, an outer side of the first connection terminal, and an outer side of the second connection terminal; and
   a capacitor structure covering an outer side of the insulating dielectric layer, a top surface of the insulating dielectric layer, and a top surface of the second connection terminal, the capacitor structure being electrically connected to the second connection terminal.

2. The memory cell structure according to claim 1, wherein
   the word line structure comprises a word line dielectric layer and a word line conductive layer positioned on an outer side of the word line dielectric layer.

3. The memory cell structure according to claim 2, wherein
   the word line dielectric layer covers an outer side of the channel region and an outer side of the second connect terminal.

4. The memory cell structure according to claim 1, wherein
   the insulating dielectric layer comprises a connection terminal dielectric layer and a word line structure insulating layer, the connection terminal dielectric layer covering the first connection terminal and the second connection terminal, and the word line structure insulating layer covering the word line structure.

5. The memory cell structure according to claim 4, wherein
   the connection terminal dielectric layer is a silicon nitride layer, the word line structure insulating layer is a silicon oxide layer.

6. The memory cell structure according to claim 4, wherein
   the word line structure insulating layer cover an outer side of the connection terminal dielectric layer.

7. The memory cell structure according to claim 1, wherein
   the capacitor structure comprises a top electrode, a bottom electrode, and a capacitor dielectric layer;
   the bottom electrode covers the outer side of the insulating dielectric layer, the top surface of the insulating dielectric layer, and the top surface of the second connection terminal, and the bottom electrode being electrically connected to the second connection terminal;
   the capacitor dielectric layer covers a surface of the bottom electrode; and
   the top electrode covers a surface of the capacitor dielectric layer.

8. The memory cell structure according to claim 7, further comprising:
   a bit line structure insulating layer positioned between the bit line structure and the capacitor dielectric layer.

9. The memory cell structure according to claim 1, wherein
   the active region comprises an indium gallium zinc oxide layer.

10. The memory cell structure according to claim 1, further comprising:
    a bit line structure insulating layer positioned between the bit line structure and the capacitor structure.

11. A memory array structure, comprising:
    a plurality of memory cell structures according to claim 1, the plurality of memory cell structures being arranged in an array of multiple rows and multiple columns; wherein
    the bit line structures of the plurality of memory cell structures positioned in the same row are electrically connected to each other;
    the word line structures of the plurality of memory cell structures positioned in the same column are electrically connected to each other; and
    the capacitor structures of the plurality of memory cell structures comprise top electrodes, capacitor dielectric layers and bottom electrodes stacked in sequence from top to bottom, the top electrodes of the capacitor structures being connected to each other, the capacitor dielectric layers of the capacitor structures being connected to each other, and the bottom electrodes of the capacitor structures being separated from each other by the capacitor dielectric layers.

12. The memory array structure according to claim 11, wherein
    an active region dielectric layer is provided between the plurality of memory cell structures positioned in the same column, and the active regions of the plurality of memory cell structures in the same column being separated from each other by the active region dielectric layer.

13. A semiconductor structure, comprising
    multiple layers of the memory array structures according to claim 6, the memory array structures of each layer being stacked from top to bottom, and an isolation layer being provided between adjacent two of the memory array structures; wherein
    the word line structures, the bit line structures and the capacitor structures between the memory array structures of each layer are independent of each other.

* * * * *